United States Patent
Decker et al.

(10) Patent No.: US 6,300,156 B1
(45) Date of Patent: Oct. 9, 2001

(54) PROCESS FOR FABRICATING MICROMECHANICAL DEVICES

(75) Inventors: Robert LeRoy Decker, Parsippany; Valerie Jeanne Kuck, Upper Montclair; Mark Anthony Paczkowski, Andover; Peter Gerald Simpkins, Chatham, all of NJ (US)

(73) Assignees: Agere Systems Optoelectronics Guardian Corp., Orlando, FL (US); Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/544,235

(22) Filed: Apr. 7, 2000

(51) Int. Cl.[7] .................................................. H01L 21/00
(52) U.S. Cl. ........................... 438/52; 438/415; 438/723; 438/745; 438/747; 438/924
(58) Field of Search .............................. 438/52, 689, 690, 438/723, 735, 745, 747, 756, 924, 928; 257/415

(56) References Cited

U.S. PATENT DOCUMENTS

| | | | |
|---|---|---|---|
| 4,285,892 | * 8/1981 | Betsuda et al. ....................... | 264/443 |
| 4,871,418 | * 10/1989 | Wittlinger et al. .................. | 438/106 |
| 5,178,725 | * 1/1993 | Takeno et al. ......................... | 216/87 |
| 5,994,159 | 11/1999 | Aksyuk et al. ......................... | 438/52 |

OTHER PUBLICATIONS

Pister et al., *Sensors and Actuators*, "Microfabricated Hinges", vol. A33, pp. 249–256, 1992.

Xiao et al., *Journal of Micromechanics and Microengineering*, "A New Release Process for Polysilicon Surface Micromachining Using Sacrifice", pp. 300–304, 1999.

* cited by examiner

Primary Examiner—Charles Bowers
Assistant Examiner—Asok Kumar Sarkar
(74) Attorney, Agent, or Firm—Richard J. Botos

(57) ABSTRACT

A process for fabricating a MEMS device is disclosed. The device has at least one hinged element. The MEMS device including the hinged element is delineated and defined on a semiconductor substrate. The substrate is placed device side down in a chamber. The MEMS device is then exposed to a release expedient for sufficient amount of time for the release expedient to dissolve a sacrificial material connecting the element to the substrate. Upon the dissolution of the sacrificial material, the element is released from the substrate and pivots away from the surface.

13 Claims, 4 Drawing Sheets

PROCESS FOR FABRICATING MICROMECHANICAL DEVICES

FIELD OF THE INVENTION

The present invention relates generally to processes for fabricating micromechanical devices, and more particularly, micro-electro-mechanical systems (MEMS) that are components of optical communication systems.

DESCRIPTION OF THE RELATED ART

MEMS devices are miniature mechanical devices that are controlled by electrical or optical signals. Such devices have dimensions that are typically less than one millimeter, with some dimensions being on the order of one micron or less. In order to fabricate mechanical devices on this size scale, microfabrication techniques have been developed.

Microfabrication techniques for MEMS devices utilize the lithographic techniques used to fabricate semiconductor integrated circuits. In integrated circuit fabrication, a layer or layers of material are deposited on a substrate (typically a semiconductor substrate with one or more layers of material formed thereon). Lithography is then used to pattern the layer or layers into the desired shape. In lithography, a pattern is defined in an energy sensitive material that is formed over the layer or layers to be patterned. An image of the pattern is then delineated in the energy sensitive material. The image is delineated using techniques such as projection lithography (i.e. projecting radiation through a mask that patterns the radiation and transfers an image of the mask into the energy-sensitive material) or direct write lithography (a beam or radiation is used to write the pattern into the energy-sensitive resist material). After delineation, the image is developed into a pattern, and the pattern is transferred into the underlying layer using expedients such as plasma etching or reactive ion etching (RIE).

In MEMS fabrication, a plurality of polycrystalline silicon (polysilicon) layers are deposited on a single crystal substrate (e.g. a silicon substrate). The structure also has a layer or layers of silicon oxide or silicon nitride incorporated therein. The materials are selected because certain etch expedients are selective for one or the other of these materials. That is, expedients that quickly etch polysilicon, etch silicon oxide or silicon nitride more slowly and vice-versa. This etch selectivity is exploited to selectively remove certain portions of one layer of material while a portion of another layer remains intact.

In MEMS fabrication, the three-dimensional structures are frequently defined and delineated using a technique known a surface-micromachining. The technique is described in Pister et al., "Microfabricated Hinges," *Sensors and Actuators*, Vol. A33, pp. 249–256 (1992). In surface-micromachining, a member is delineated and defined in a layer or layers of material formed on a substrate. The member is in hinged connection with a support layer. The member is then released from the substrate by removing a sacrificial layer of silicon oxide that tethers the member to the substrate. Since the member is in hinged connection with the support layer, it is then capable of being pivoted out of the plane of the support layer after release. Thus, such members, upon release, are pivoted out of the plane of the layer in which they are fabricated to assemble three-dimensional structures. With surface-micromachining of hinged members, higher resolution (i.e. a more precise delineation and definition) of the members that form the three-dimensional structure is obtained than if the three dimensional structure was fabricated using a three-dimensional fabrication process. The higher resolution derives from the fact that high vertical resolution (i.e. resolution in the direction normal to the substrate surface) is more difficult to obtain than planar resolution (i.e. resolution in the plane of the layer). Surface-micromachining of hinged members combines the advantage of high planar resolution of the members with the ability to assemble three-dimensional structures from the members after they are released from the substrate.

A self-assembling micro-mechanical device formed by surface micromachining is described in U.S. Pat. No. 5,994,159 to Aksyuk et al. The device has a hinged plate and a beam having one end that is moveable, upon actuation, in an upwardly directed arc away from a support surface. The beam and hinged plate are defined and delineated to lie flat on the surface of a supporting substrate. The hinged plate is released from the substrate surface in the previously described manner. Upon release, it is desired for the plate to pivot out of the plane of the substrate and into a plane orthogonal to the substrate.

One problem with manufacturing such MEMS devices is that, occasionally, a plate does not release (i.e. pivot away from the substrate) after the sacrificial underlying layer of silicon dioxide has been removed. If the plates fail to pivot, then the device will not operate in its intended manner. Therefore a process for fabricating MEMS devices that ensures the release of hinged components when the underlying layer is removed is sought.

SUMMARY OF THE INVENTION

The present invention is directed to a process for fabricating a MEMS device. In the process, at least one hinged member is lithographically defined in a top silicon layer of a silicon on insulator (SOI) semiconductor substrate. The insulator is a silicon compound such as silicon dioxide or silicon nitride. The substrate is then placed face down and immersed in an etchant that etches the insulator at a much faster rate than it etches the top silicon layer. Aqueous hydrofluoric acid is one example of a suitable etchant. The substrate is placed face down to ensure that the hinged member pivot away from the substrate in the intended manner when the insulator is etched away from the hinged member. When the substrate is free to pivot away from the substrate, the hinged member is referred to herein as having been released. It is advantageous if agitation is applied to the etchant in which the hinged member is placed.

As a result of being placed face down in the etchant, after the portion of the insulator layer underlying the hinged member is removed, the hinged member pivots away from the substrate to the desired degree. The hinged member is then rinsed in a solvent and dried while face down.

Other objects and features of the present invention will become apparent from the following detailed description considered in conjunction with the accompanying drawings. It is to be understood, however, that the drawings are designed solely for purposes of illustration and do not serve to limit the invention, for which reference should be made to the appended claims.

DETAILED DESCRIPTION

The present invention is directed to a process for fabricating a MEMS device. The MEMS device has at least one hinged member. The hinged member is in hinged engagement with a supporting silicon layer, which is the top silicon layer on an SOI substrate.

In the context of the present invention, the member is delineated and defined in a layer of material. Thus, the member is in the plane of the layer when fabricated. For convenience, this in-plane position is referred to as the first position of the member. After, fabrication, the hinged member pivots out of the plane of the layer of material. This out-of-plane position is the second position. In the second position, the member is substantially orthogonal to the supporting silicon layer. The movement from the first position to the second position is referred to as the release of the member herein.

Microfabrication techniques for forming MEMS members in SOI substrates are well known to one skilled in the art. Such microfabrication techniques are described in U.S. Pat. No. 5,994,159 to Aksyuk et al., which is hereby incorporated by reference. The fabrication of hinged plates is described in Pister et al., "Microfabricated Hinges," *Sensors and Actuators*, Vol. A33, pp. 249–256 (1992), which is also incorporated by reference.

Figure 1A:
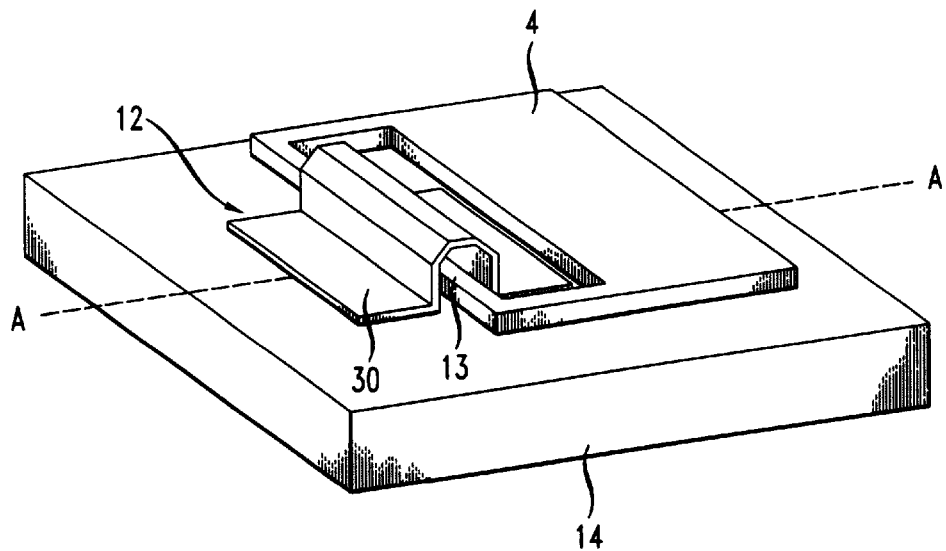
FIGS. 1A and 1B are perspective views of a MEMS hinged plate in its unreleased and released states.
Figure 1B:
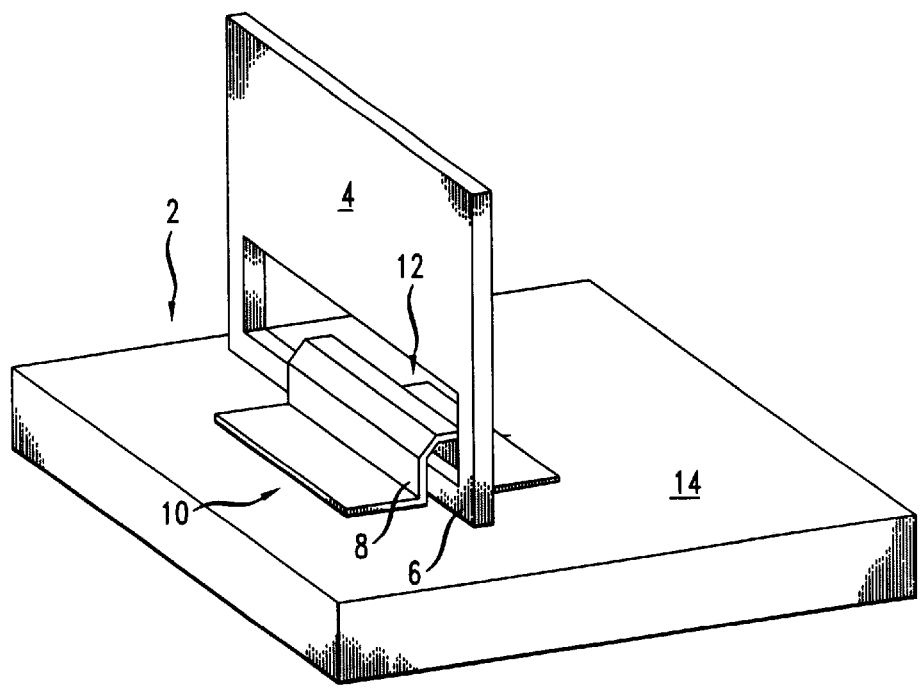

FIG. 1A and 1B illustrates a self-assembling MEMS member in its released and unreleased states. As used herein, the term self-assembly means that, upon delineation and definition, the member pivots from its first position to its second position without the application of a separate, actuating force. Applicants have observed that it is difficult to get the hinged members to release consistently. That is, some, but not all, hinged members release.

For simplicity, the process of the present invention will be described in terms of the fabrication of a single hinged member. One skilled in the art will appreciate that this process is readily adapted to the fabrication of any hinged member to effect its release upon definition and delineation. The exemplary hinged member is described with reference to FIG. 1A. The member 4 is pivotally attached to the underlying substrate 14 via hinge 12. After delineation, the member 4 pivots to the second position, illustrated in FIG. 1B.

In order to cause the hinged member to pivot from the first position to the second position without the application of an actuating force, a structure that defines the hinge and member is formed. Both the hinge 12 and the member 4 are made of polycrystalline silicon. The structure has oxide sacrificial layers. The structure is illustrated in FIG. 2A.

Figure 2A:
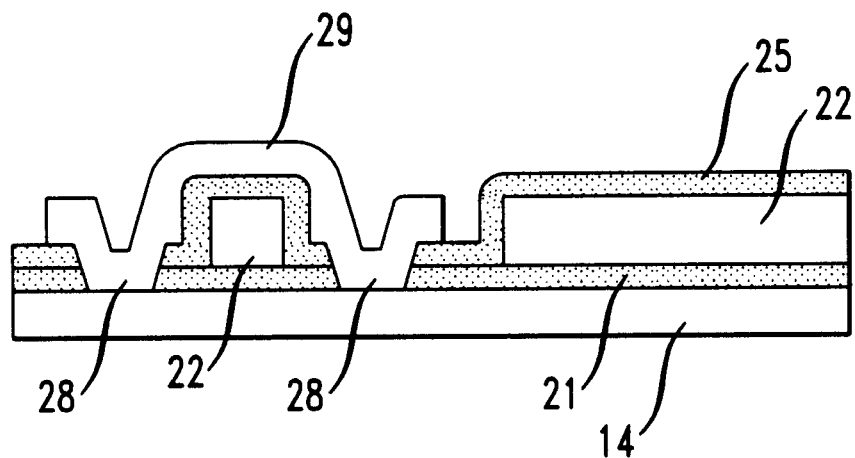
FIGS. 2A and 2B are cross-sectional views of the MEMS hinged plate along line A—A of FIG. 1A in its unreleased and released states.

The structure in FIG. 2A is fabricated by depositing a layer of doped silicon oxide (e.g. phosphosilicate glass) 21 on a bare silicon substrate 14. A first layer of polycrystalline silicon 22 is formed over the silicon oxide layer 21. A second layer of phosphosilicate glass (not shown) is formed over the polycrystalline silicon layer. All depositions are performed using low-pressure chemical vapor deposition (LPCVD). The resulting multilayer structure is annealed at 950° C. in a nitrogen ambient for one hour to reduce the vertical stress gradients in the polycrystalline silicon.

The second layer of phosphosilicate glass is removed using an aqueous solution of hydrofluoric acid. The first polysilicon layer 22 is then patterned using conventional lithography in which a layer of energy sensitive material is formed over the polysilicon layer. An image is introduced into the energy sensitive material and the image is developed using conventional expedients well known to one skilled in the art. The resulting pattern is then transferred into the polysilicon layer 22 using a conventional plasma etch expedient (e.g. $CCl_4$, helium and oxygen). The patterned polysilicon layer defines the member 4 and the pin 13 of the hinge 12 (FIG. 1A).

A second sacrificial layer of phosphosilicate glass 25 is then formed over the patterned polysilicon layer 22. Both the first and second sacrificial layers of phosphosilicate glass 21, 25 are then patterned. Conventional lithography followed by a plasma etch (e.g. $CF_4$, $CHF_3$ and helium) is an example of a suitable process for patterning the phosphosilicate glass layers. This etch defines the contacts 28 between the substrate 14 and the second polysilicon layer 29. The second layer of polysilicon 29 is formed over the resulting structure. The second layer of polysilicon 29 is deposited, covered with a doped oxide (e.g. phosphosilicate glass; not shown) and annealed in the same manner as the first polysilicon layer 22.

The doped oxide is then removed and the polysilicon layer 25 is patterned using lithography and plasma etching as described for the first polysilicon layer 22. The second polysilicon layer defines the staple 30 of hinge 12 (FIG. 1A).

Figure 2B:
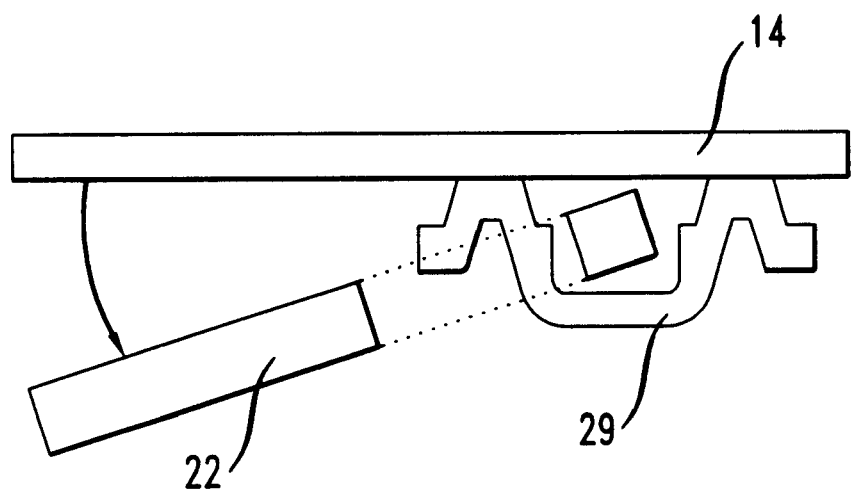

Referring to FIG. 2B, the structure in FIG. 2A is inverted and placed in a carrier (not shown). The carrier is joined to a holder such that the structure is suspended face down in a chamber. It is advantageous if the holder is subjected to agitation. The agitation conditions are largely a matter of design choice and are selected to provide an environment where adequate release of the hinges is obtained without damaging the hinges. In this regard, gentle agitation is prescribed. Gentle agitation is achieved by controlling the power transferred into the system from the agitator. The power is maintained below the power level that is likely to damage the particular devices. A variety of agitators are contemplated as suitable. Vertical displacement agitators (i.e. the holder is placed on a vibrating stage) have been found to provide the desired gentle agitation. In the context of the embodiments of the present invention, a range of vertical agitation conditions are contemplated as suitable. Specifically, agitation conditions that provide a vertical displacement of up to about 50 $\mu$m are acceptable. In order to control the power transferred to the system, the frequency of the agitation does not exceed about 100 Hz.

A cleaning solvent (e.g. acetone) for removing organic material (i.e. a protective coating) first flows through the chamber and contacts the structure. The up and down motion of the vibrating stage agitates the liquid in the chamber, assuring complete and uniform contact between the liquid and the structure. This is followed by a rinse to remove soluble inorganic ions from the structure. Deionized water is suitable for this rinse. The structure is rinsed again, this time to remove the residual water. A polar solvent with a low (below 100° C.) boiling point (e.g. methanol) is suitable for this rinse. As with the previous rinses, the solvent flows through the chamber and contacts the structure.

The chamber is then purged (e.g. with nitrogen gas) to dry the structure. The time and flow rates for the cleaning and nitrogen purges are largely a matter of design choice. About 10 ml/min for three minutes is suitable for the solvent clean and rinses. About 100 cc/min for 3 minutes is suitable for the nitrogen purge.

The chamber is then filled with an etchant for the doped silicon oxide layer 21 (FIG. 2A). The chamber is filled such that the structure depicted in FIG. 2A is immersed in the etchant. Suitable etchants include aqueous HF (forty-nine to fifty one percent HF concentration) and buffered HF. The HF solution selectively removes the oxide. During the etch, the chamber remains under agitation. After the oxide is removed, hinged member 22 is released. It is observed by applicants that a greater percentage of hinges are completely released during this step when the chamber is under agitation compared to the percentage of hinges that release when agitation is not applied. The structure remains in the aqueous solution for a time sufficient to effect release. This time will vary depending on the concentration of the aqueous HF solution and the thickness of the oxide layers 21 and 25.

After release, the structure is then rinsed. Water followed by methanol is an example of a suitable rinse. The structure remains immersed in methanol until drying is achieved. It is advantageous if the chip holder containing the structure is removed from the chamber and, while the structure is still face down, placed in a $CO_2$ drier. One example of a $CO_2$ drier is a supercritical $CO_2$ drier. In the supercritical $CO_2$ drier, liquid $CO_2$ or gaseous $CO_2$ above the super critical point is introduced to replace the methanol. The $CO_2$ is then allowed to go to the gaseous phase to dry the structure. This process ensures that surface tension forces do not draw the hinge back to the substrate.

Figure 3:
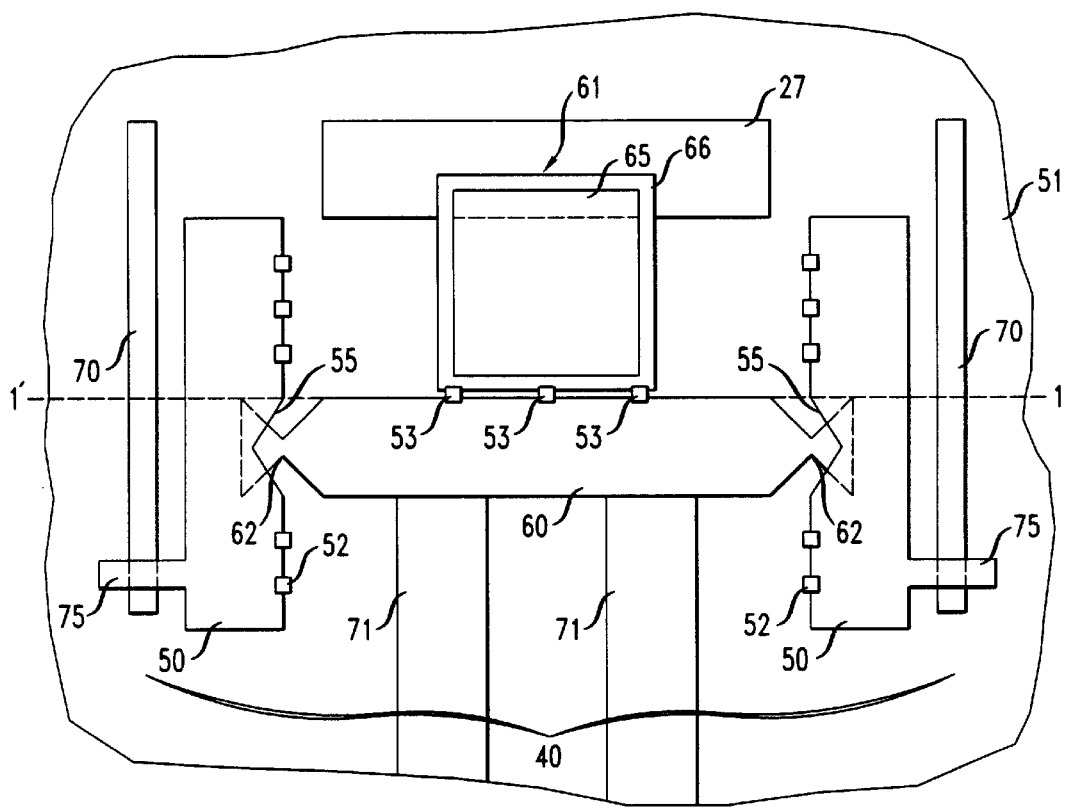
FIG. 3 is a perspective view of an optical mirror device in its unreleased state.

The MEMS optical device 40 depicted in FIG. 3 is representative of the MEMS devices that were released according to the procedure described below. The MEMS device is delineated and defined using a surface micromachining technique. The structure includes a plate 50 in hinged attachment to the surface of substrate 51 via hinges 52. The hinged plate includes a V-shaped notch 55. The hinged plates 50 are coupled to an engagement plate 60. The engagement plate 60 has tapered sections 62. The relative position of the V-shaped notch 55 and the tapered section 62 is such that the v-shaped notch 55 captures the tapered section 62. Engagement plate 60 is also in hinged attachment (via hinges 53) to optical device 61. The optical device 61 is a mirror 65 that is pivotally fixed in support frame 66.

Figure 4:
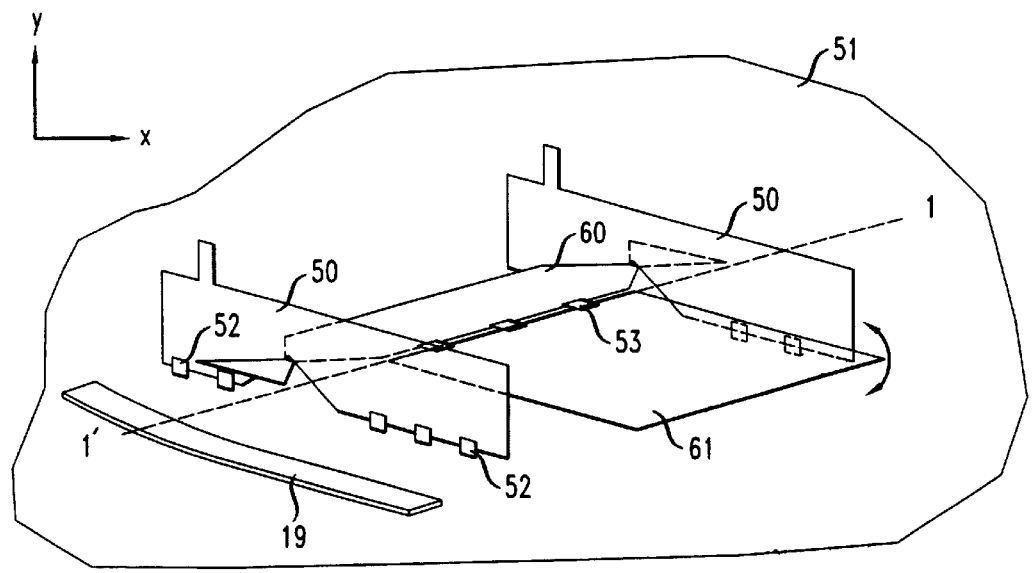
FIG. 4 is a perspective view of the optical mirror device of FIG. 3 in its released state.

The planar structure depicted in FIG. 3 forms the three dimensional structure depicted in FIG. 4 when subjected to a release process. In the release process for the structure depicted in FIG. 3, actuator 70 is provided to elevate the plate 50 to a position above the substrate surface. Subsequently, actuator 71 lifts engagement plate 60 so that the tapered sections 62 in engagement plate 60 are captured in the V-shaped groove of plate 50.

Because of the multilayered nature of the structure depicted in FIG. 3, and the varied size of the members, some members (i.e. actuator 70) release before other members (i.e. engagement plate 60). The reason for this time delay is readily understood. Specifically, referring to FIG. 3, the ends of engagement plate 60 underlie the plates 50. Portions of actuators 70 underlie tab 75 of plates 50. Furthermore, actuator 70 is much narrower than engagement plate 60. For these reasons, actuator 70 and plate 50 release before engagement plate 60.

Because of the non-uniform release of the various members that make up the device, the orientation of the structure during release is not predictable. In the process of the present invention, the structure and the liquids in which the structure is placed during release are agitated. The agitation, when coupled with release while the structure is in a face down orientation, provides for a more uniform orientation of the devices upon release. Release in a face down orientation with agitation also reduces the stress on individual members of the structure, compared to release in a face up orientation with agitation. This is because face down release with agitation requires less power than face up release with agitation.

Actuators 70 and 71 are provided to actuate the pivot of the plates 50 to a position perpendicular to the substrate surface. The plates 50 in their pivoted position are illustrated in FIG. 4. Actuators 70 and 71 are depicted as elongated members. These members are fixed to the substrate at a distal end. The proximate end of actuators 70 is disposed underneath tabs 75 of plates 50. The proximate end of actuators 71 is disposed underneath engagement plate 60.

The actuators are configured so that their proximate ends lift in an upward direction in response to the application of an actuating force. Actuators 70 lift tabs 75 to pivot plate 50 toward its upright position. Plate 50 in its upright position is illustrated in FIG. 4. Actuators 70 lift engagement plate 60, which, it turn, lifts plate 50 to its upright position. The optical device 40 with hinged plate 50 in its upright position is depicted in FIG. 4.

EXAMPLE 1

Figure 5:
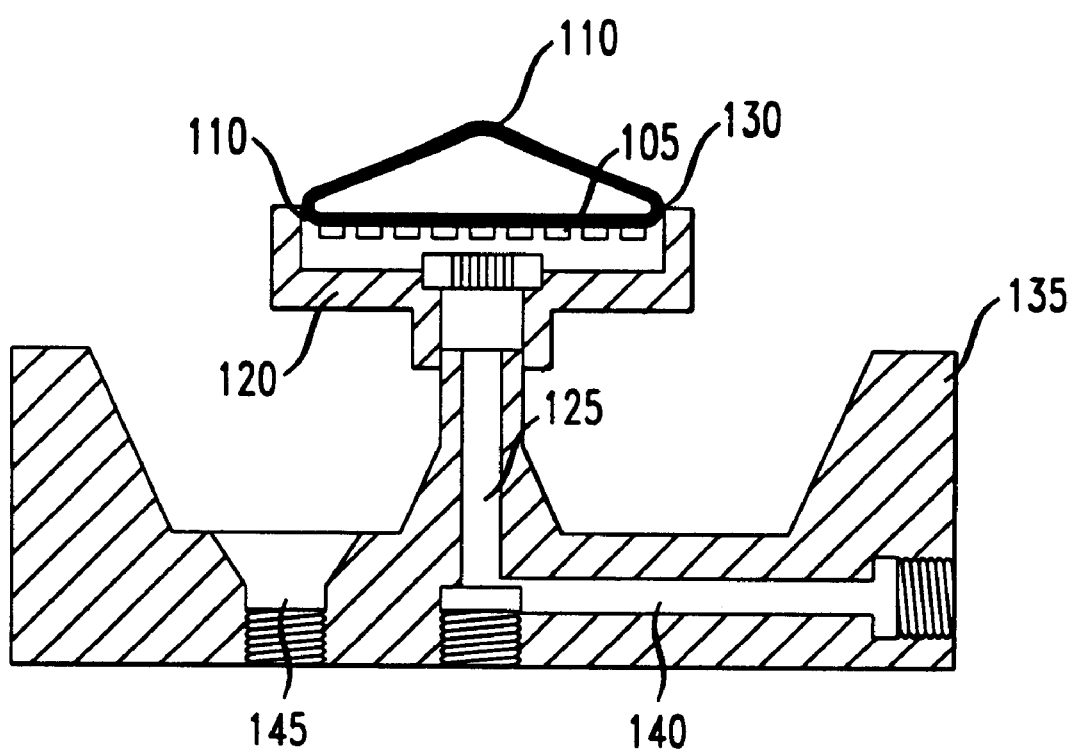
FIG. 5 is a cross sectional view of a chip holder with a chip in place during processing.

In this example, a hinged plate was released according to the process of the present invention. This example is described with reference to FIG. 5. Specifically, substrates 101 with a plurality of structures 105 having hinged plates (not shown) similar to those depicted in FIG. 3 were placed in a chip-carrier 110 and locked into position. The chip-carrier 110 was seated onto a chamber 120 such that the substrate was suspended in the chamber 120 face down. The chamber 120 was affixed to a base 135. The base had an inlet 140 in fluid communication with the chamber inlet 125. The base also had a drain 145 for draining away the overflow from the chamber 120. The chamber 120 was equipped with an inlet 125 and an overflow 130 for flowing fluids through the chamber 120. Low frequency (i.e. 50–60 Hz in the vertical direction) agitation was provided to the chamber 120. For these examples the vertical displacement was varied between about 100 $\mu$m and 450 $\mu$m.

The shaker control was turned on and the desired displacement was selected. Acetone was introduced into the chamber at a rate of 10 ml per minute for three minutes. The acetone was used to remove the organic materials from the substrates. Following the acetone, deionized water was then introduced into the chamber at a rate of 10 ml per minute for three minutes. The deionized water was provided to rinse the soluble inorganic compounds from the structure. Methanol was then introduced into the chamber at a rate of 10 ml per minute for three minutes to remove the residual water. Following the methanol rinse, nitrogen was introduced into the chamber at a rate of 100 cc per minute for three minutes.

Following the nitrogen purge, the chamber was filled with aqueous hydrofluoric acid (48 percent to 51 percent HF). The structure was immersed in the aqueous hydrofluoric acid for five minutes. After five minutes, the chamber was purged with water at a flow rate of 10 ml/min. Methanol was then introduced into the chamber at a flow rate of 10 ml per minute for 10 minutes.

The carrier with the substrate was then removed from the chamber. The carrier and substrate were immediately placed in a supercritical carbon dioxide dryer. The dryer, model CPD030, was obtained from Bal-Tec AG of Balzers, Germany. When transferring the substrate from the chamber to the dryer, the chip remained immersed in methanol. The methanol was replaced by the liquid carbon dioxide introduced into the dryer.

The release of hinges using the face down process of the present invention was compared with the release of hinges using a standard process (i.e. the substrate is face up during release). The percentage of devices that released (i.e. the number of hinges that pivoted to form a 90 degree angle with the substrate surface) as a percentage of the total number of devices on a single substrate was determine for the devices released using the process of the present invention. Four substrates were evaluated, each having 256 devices formed thereon. The substrates were evaluated for the number of hinges that were released within a certain tolerance. Release was determined by measuring the degree of tilt associated with the engagement plate (a representative engagement plate 60 is illustrated in FIG. 3). A released engagement plate that is parallel to the substrate has zero tilt. An engagement plate that has an end that is 2 $\mu$m from where it would be if the plate were completely parallel has a tilt of 2 $\mu$m.

For most applications, there is a tolerance for some tilt in the engagement plate. Thus, release was measured by determining the percent of engagement plates that were within a certain degree of tilt with the substrate. The number of engagement plates that had plus-or-minus 2 $\mu$m of tilt (condition A) is reported in Table 1 below as the percentage of the 256 devices that satisfied condition A. The number of engagement plates that had plus-or-minus 10 $\mu$m of tilt is reported in Table 1 below as the percentage of the 256 devices that satisfied condition B. The sample number indicates the type of hinge that was evaluated.

TABLE 1

| Sample No. | Percent of Hinges that Satisfy Condition A | Percent of Hinges that Satisfy Condition B |
| --- | --- | --- |
| 1 | 98 | 98 |
| 2 | 94 | 100 |
| 3 | 98 | 99 |
| 4 | 92 | 100 |
| 5 | 95 | 99 |
| 6 | 95 | 97 |
| 7 | 99 | 100 |
| 8 | 94 | 98 |

These results were compared with the release of hinges using a standard face up process. In the face up process used for this comparison, the hinges were the same as those previously described in this example. The materials and conditions for release (i.e. the fluids and their flow rates) were identical to the release conditions for the face down process. The release of the hinges when the substrate was placed face up in the aqueous hydrofluoric acid is reported in Table 2 below.

TABLE 2

| Sample No. | Percent of Hinges that Satisfy Condition A | Percent of Hinges that Satisfy Condition B |
| --- | --- | --- |
| 9 | 80 | 98 |
| 10 | 87 | 95 |
| 11 | 77 | 95 |
| 12 | 50 | 82 |
| 13 | 42 | 98 |
| 14 | 42 | 98 |
| 15 | 40 | 98 |

TABLE 2-continued

| Sample No. | Percent of Hinges that Satisfy Condition A | Percent of Hinges that Satisfy Condition B |
| --- | --- | --- |
| 16 | 93 | 95 |

Comparing the results of Table 1 with Table 2, it is readily observed that the process of the present invention provides for more complete and uniform hinge release than a face up process. This is particularly apparent when comparing the percentage of percentage of hinges that satisfied condition A in Table 1 with the percentage of hinges that satisfied condition A in FIG. 2. With face down release (Table 1) over ninety percent of the hinges satisfied condition A for every sample. With face up release (Table 2) the percentage of hinges that satisfied condition A was as low as 18 percent and was substantially less than ninety percent for almost every sample.

The effect of the degree of agitation on hinge release was also evaluated. The release of three different types of hinges was evaluated. Substrates, each with 256 devices formed thereon, were subjected to the face down release procedure described above. Two substrates had a first type of hinge, three substrates had a second type of hinge and two substrates had a third type of hinge.

For the two substrates with the first type of hinge, one substrate was subjected to a vertical displacement of 50 $\mu$m during the release. The other was subjected to a vertical displacement of 100 $\mu$m during the release. About seventy five percent of the hinges on the first substrate released to condition A compared to about ninety-five percent for the second substrate. Thus, the increase in vertical displacement (i.e. agitation) of the substrate provided an increase in the percentage of hinges that released.

For the three substrates with the second type of hinge, one substrate was subjected to a vertical displacement of 50 $\mu$m during the release. A second was subjected to a vertical displacement of 100 $\mu$m during the release. The third was subjected to a vertical displacement of 400 $\mu$m during the release. About eighteen percent of the hinges on the first substrate released compared to about eighty percent for the hinges on the second substrate and one hundred percent for the hinges on the third substrate. Thus, the increase in vertical displacement (i.e. agitation) of the substrate provided an increase in the percentage of hinges that released.

For the two substrates with the third type of hinge, one substrate was subjected to a vertical displacement of 50 $\mu$m during the release. The other was subjected to a vertical displacement of 400 $\mu$m during the release. About forty percent of the hinges on the first substrate released compared to about one hundred percent for the second substrate. Thus, the increase in vertical displacement (i.e. agitation) of the substrate provided an increase in the percentage of hinges that released.

The amount of agitation required to effect release may vary from hinge type to hinge type. However, it was observed that an agitation that provides a vertical displacement of at least about 50 $\mu$m at 60 Hz was required to effect a release that satisfies condition A for ninety percent of the devices.

The invention claimed is:
1. A process for microfabrication comprising:
   defining a hinged member on a surface of a semiconductor substrate wherein the member is a polycrystalline silicon member and the member is tethered to the substrate by a sacrificial layer;

placing the hinged member in an expedient for selectively removing the sacrificial layer without removing the polycrystalline member wherein the surface of the semiconductor substrate on which the hinged member is defined is face down;

removing the sacrificial layer; and drying the hinged member while the semiconductor substrate is in the face down position.

2. The process of claim 1 wherein the substrate and the expedient in which it is placed is agitated during the removal of the sacrificial layer.

3. The process of claim 2 wherein the sacrificial layer is selected from the group consisting of silicon nitride and silicon dioxide.

4. The process of claim 2 further comprising removing organic materials from the substrate surface prior to removing the sacrificial layer.

5. The process of claim 4 wherein the organic materials are removed by rinsing the substrate with a solvent for organic materials.

6. The process of claim 5 wherein the solvent for organic materials is acetone.

7. The process of claim 4 further comprising removing inorganic materials from the substrate surface prior to removing the sacrificial layer.

8. The process of claim 7 wherein the inorganic materials are removed by rinsing the substrate with deionized water.

9. The process of claim 8 further comprising removing the deionized water.

10. The process of claim 9 wherein the deionized water is removed by rinsing the substrate with methanol.

11. The process of claim 2 further comprising immersing the hinged member in a liquid after removal of the sacrificial layer and keeping the hinged member immersed in the liquid until the liquid is replaced by a drying expedient.

12. The process of claim 11 wherein the drying expedient is carbon dioxide.

13. The process of claim 2 wherein the applied agitation provides a vertical displacement of about 50 $\mu$m to about 400 $\mu$m at a frequency of less than about 100 Hz.

\* \* \* \* \*